United States Patent
Akikuni et al.

(10) Patent No.: US 6,388,454 B1
(45) Date of Patent: May 14, 2002

(54) ELECTRO-OPTIC SAMPLING PROBER

(75) Inventors: Fumio Akikuni; Katsushi Ohta, both of Tokyo; Mitsuru Shinagawa, Isehara; Tadao Nagatsuma, Sagamihara; Junzo Yamada, Ebina, all of (JP)

(73) Assignees: Ando Electric Co., Ltd.; Nippon Telegraph and Telephone Corporation, both of Tokyo (JP)

( * ) Notice: Subject to any disclaimer, the term of this patent is extended or adjusted under 35 U.S.C. 154(b) by 0 days.

(21) Appl. No.: 09/452,297

(22) Filed: Nov. 30, 1999

(30) Foreign Application Priority Data

Nov. 30, 1998 (JP) .......................................... 10-340823

(51) Int. Cl.[7] ............................................ G01K 31/305
(52) U.S. Cl. .................................... 324/751; 324/158.1
(58) Field of Search .............................. 324/158.1, 751, 324/752, 753, 96; 356/382; 422/82.08; 250/310, 311

(56) References Cited

U.S. PATENT DOCUMENTS

| | | | | |
|---|---|---|---|---|
| 4,355,278 A | * | 10/1982 | Burns et al. | 324/158.1 |
| 4,564,808 A | * | 1/1986 | Faughnan et al. | 324/158.1 |
| 4,891,580 A | | 1/1990 | Valdmanis | |
| 4,928,058 A | * | 5/1990 | Williamson | 324/96 |
| 5,394,098 A | * | 2/1995 | Meyrueix et al. | 324/750 |
| 5,450,205 A | * | 9/1995 | Sawin et al. | 356/382 |
| 5,767,688 A | * | 6/1998 | Takahashi et al. | 324/753 |
| 5,872,360 A | * | 2/1999 | Paniccia et al. | 324/753 |
| 5,955,030 A | * | 9/1999 | Pettit | 422/82.08 |
| 6,057,677 A | * | 5/2000 | Wakana et al. | 324/96 |

FOREIGN PATENT DOCUMENTS

EP           0702236         3/1996

* cited by examiner

Primary Examiner—Michael J. Sherry
Assistant Examiner—Jimmy Nguyen
(74) Attorney, Agent, or Firm—Blakely Sokoloff Taylor & Zafman

(57) ABSTRACT

An electro-optic sampling prober is used to measure a waveform of a measured signal applied to wiring of an IC wafer. Herein, a laser radiates laser beams, which are supplied to an optical module containing an optical isolator and photodiodes by way of an optical fiber. Then, the laser beams pass through an optical wavelength filter to propagate through a prober unit. The laser beams are incident on an electro-optical element, which is changed in polarization state in response to an electric field being caused by the measured signal. The laser beams are reflected by a surface mirror of the electro-optical element, so that reflected beams propagate back through the prober unit and are returned to the optical module by way of the optical wavelength filter. During the measurement, a human operator watches an image of a selected portion of the IC wafer presently placed beneath the prober unit to adjust a positional relationship between the prober unit and IC wafer. The image is produced by an infrared camera equipped with a halogen lamp and a monitor. Incidentally, the optical wavelength filter has an optical characteristic such that a center wavelength in transmission of light coincides with a wavelength of the laser beams whose intensities are maximal, so it is possible to prevent components of light, which are not required for measurement, from being unnecessarily returned to the optical module, and it is possible to improve a S/N ratio in measurement.

1 Claim, 8 Drawing Sheets

ELECTRO-OPTIC SAMPLING PROBER

BACKGROUND OF THE INVENTION

1. Field of the Invention

This invention relates to electro-optic sampling probers that are used to measure waveforms of measured signals by using electro-optical crystals.

This application is based on Patent Application No. Hei 10-340823 filed in Japan, the content of which is incorporated herein by reference.

2. Description of the Related Art

The electro-optic sampling probers utilize electro-optic probes, which operate as follows:

Electric fields caused by measured signals are applied to electro-optical crystals, on which laser beams being produced based on timing signals are incident. Waveforms of the measured signals are measured for observation in response to polarization states of the laser beams, which are changed in response to the electric fields. Herein, by making the laser beams in a pulse-like form for sampling of the measured signals, it is possible to measure the waveforms with a very high resolution with respect to time.

As compared with the conventional probers using electric probes, the electro-optic sampling probers (abbreviated by "EOS probers") draw considerable attention of engineers and scientists because of some advantages as follows:

(1) At measurement of signals, the EOS probers do not require ground lines. So, it is possible to perform measurement with ease.

(2) Tip ends of the EOS probers are insulated from the circuitry, so it is possible to realize high input impedance. Therefore, the EOS probers do not substantially disturb states of measuring points.

(3) Because the EOS probers utilize optical pulses for measurement, it is possible to perform measurement of a broad band, a frequency range of which is in Giga-Hertz (GHz) order.

(4) The EOS probers are designed such that electro-optical crystals are brought in contact with wafers of integrated circuits having wires, on which laser beams are converged. So, the EOS probers are capable of performing measurement with respect to fine wires, which cannot be brought in "physical" contact with metal pins.

For convenience sake, the following description uses a specific unit of nano-meter (nm) for dimension of the wavelength of light.

Now, an example of a construction of an EOS prober will be described with reference to FIG. 6. In FIG. 6, an IC wafer 1 is connected to the external (i.e., device or system, not shown) by way of power lines and signal lines. A electro-optical element 2 is configured using an electro-optical crystal. An objective lens 3 converges beams to be incident on the electro-optical element 2. A prober unit 4 is equipped with a dichroic mirror 4a, a half mirror 4b and a reflecting mirror 4c. An EOS optical module (or EOS optical system) is constructed using photodiodes, polarization beam splitters and wavelength plates, all of which are not shown.

An optical fiber 7 is equipped with a fiber collimator 7a at a terminal end thereof. A light source (i.e., laser) 8 supplies the EOS optical system 6 with laser beams. Herein, outgoing beams of the laser 8 have a wavelength of 1550 nano-meter (nm) at maximum intensity. A halogen lamp 9 illuminates the IC wafer 1 being subjected to measurement. Incidentally, the EOS prober of FIG. 6 does not necessarily use the halogen lamp 9 for illumination of the IC wafer 1. That is, it is possible to use other lamps such as the xenon lamp and tungsten lamp.

An infrared camera (or IR camera) 10 makes confirmation with respect to the positioning for convergence of beams on the IC wafer 1. Images created by the IR camera 10 are displayed on a screen of a monitor 10a. The IR camera 10 has light-receiving sensitivity in a range of wavelengths between 500 nm and 1800 nm. An absorption stage 11 absorbs the IC wafer 1 to be fixed in position. The absorption stage 11 is capable of making small movements in x-axis, y-axis and z-axis directions, which are perpendicular to each other.

Next, optical paths of laser beams radiated from the laser 8 will be described with reference to FIG. 6. In FIG. 6, optical paths of laser beams in the prober unit 4 are designated by reference symbols A, B and C respectively.

First, laser beams output from the laser 8 pass through the optical fiber 7, in which they are converted to parallel beams by the fiber collimator 7a. The parallel beams pass through the EOS optical system 6 and are then introduced into the prober unit 4 as its incoming beams. In the prober unit 4, the incoming beams propagate along the optical path A. The incoming beams are reflected by the reflecting mirror 4c, by which they are changed in propagation direction by an angle of 90 degrees. So, reflected beams propagate along the optical path B. Herein, the reflecting mirror 4c is a surface mirror of a full reflection type, which is made by depositing aluminum material on a glass surface.

The reflected beams, corresponding to the laser beams reflected by the reflecting mirror 4c, are further reflected by the dichroic mirror 4a, wherein they are changed in propagation degree by an angle of 90 degrees. So, further reflected beams being reflected by the dichroic mirror 4a propagate along the optical path C. The objective lens 3 converges such further reflected beams onto an opposite surface of the electro-optical element 2 that is placed being opposite to face with a surface of the IC wafer 1, wherein the electro-optical element 2 is arranged on wiring (or wires) of the IC wafer 1. FIG. 7 shows an example of an optical characteristic in transmission of the dichroic mirror 4a with respect to wavelength, wherein a horizontal axis represents "wavelength" while a vertical axis represents "transmission factor". According to the optical characteristic shown in FIG. 7, the dichroic mirror 4a allows only 5% of light to transmit therethrough while reflecting 95% of light with respect to wavelength of 1550 nm. For this reason, 95% of the laser beams radiated from the laser 8 are reflected by the dichroic mirror 4a, wherein they are changed in optical path by an angle of 90 degrees.

A dielectric mirror is deposited on the opposite surface of the electro-optical element 2, which faces with the IC wafer 1. Laser beams being reflected by the dielectric mirror 4a are converted to parallel beams by the objective lens 3. Then, the parallel beams propagate back along the optical paths C, B, A in turn and are returned to the EOS optical system 6. Those beams are incident on photodiodes (not shown) within the EOS optical system 6.

Next, a description will be given with respect to operations in positioning of the IC wafer 1 in connection with the halogen lamp 9 and the IR camera 10. Specifically, the following description is given with respect to optical paths for light radiated from the halogen lamp 9 and positioning operations of the IC wafer 1. In FIG. 6, the optical paths along which the light of the halogen lamp 9 propagate are designated by reference symbols D, E and C respectively.

The light radiated from the halogen lamp 9 propagate along the optical path D and is incident on the half mirror 4b.

The half mirror 4b reflects the light by an angle of 90 degrees, so that reflected light propagate along the optical path E. The reflected light propagate straight through the dichroic mirror 4a along the optical path C so as to illuminate the IC wafer 1. Herein, the half mirror 4b is designed such that reflected light and transmitted light coincide with each other in intensity.

FIG. 8 shows an optical characteristic in radiation of the halogen lamp 9 with respect to wavelength, wherein a horizontal axis represents "wavelength" while a vertical axis represents "light intensity". FIG. 8 shows that the halogen lamp 9 radiates light in a range of wavelengths between 400 nm and 1650 nm.

The IR camera 10 picks up an infrared image with respect to a part of the IC wafer 1 within a visual field of the objective lens 3 being subjected to illumination by the halogen lamp 9. Such an infrared image is displayed on the screen of the monitor 10a. A human operator slightly moves the absorption stage 11 or the prober unit 4 while looking at the image displayed on the screen of the monitor 10a. Thus, the human operator is capable of adjusting a positional relationship between the absorption stage 11 and the prober unit 4 such that the wiring of the IC wafer 1, which is a measured subject, comes into the visual field.

The laser beams, which are radiated from the laser 8 and are introduced into the prober unit 4, are reflected by the surface of the electro-optical element 2 above the wiring of the IC wafer 1. Then, reflected beams are (partially) transmitted through the dichroic mirror 4a and are input to the IR camera 10. So, the IR camera 10 produces an image corresponding to the transmitted beams of the dichroic mirror 4a. By watching such an image, the human operator adjusts the absorption stage 11 or the prober unit 4 in position such that the laser beams are converged at a point on the surface of the electro-optical element 2 above the wiring, which is subjected to measurement. As described before, the dichroic mirror 4a has the optical characteristic that allows 5% of the laser beams, having the aforementioned wavelength, to transmit therethrough. Therefore, the human operator is capable of recognizing the laser beams by the IR camera 10.

Next, a description will be given with respect to operations to measure signals by using the EOS prober of FIG. 6.

When power voltage is applied to the wiring (or wires) of the IC wafer 1, an electric field is caused to occur and is applied to the electro-optical element 2. This causes a phenomenon in which a refractive index changes due to Pockel's effect. Due to such a phenomenon, changes occur in polarization states between incoming beams and outgoing beams of the electro-optical element 2. That is, the laser beams radiated from the laser 8 propagate along certain paths and are incident on the electro-optical element 2 as the incoming beams, so that the incoming beams are reflected by the opposite surface facing with the IC wafer 1 and are returned back along the same paths as the outgoing beams, which are changed in polarization states. Such outgoing beams whose polarization states are changed due to the electric field applied to the electro-optical element 2 propagate back along the optical paths C, B, A in turn and are then input to the EOS optical system 6.

In the EOS optical system 6 receiving the beams whose polarization states are changed, changes of the polarization states are converted to changes of light intensities, which are detected by the photodiodes to produce electric signals. Then, the electric signals are processed by a signal processing portion (not shown). Thus, it is possible to measure signals applied to the wiring of the IC wafer 1.

The aforementioned example of the EOS prober needs illumination light to illuminate the IC wafer 1, which is a measured subject, in order to perform positioning of the IC wafer 1. Herein, the illumination light is used for the positioning of the IC wafer 1, so it is preferable to turn on the light source (i.e., halogen lamp 9) of the illumination light during measurement.

However, the aforementioned EOS prober is designed such that the optical paths of the light of the halogen lamp 9 coincide with the optical paths of the laser beams used for the measurement. In some case, the illumination light are introduced into the EOS optical system, which performs the measurement, as optical noise. So, there is a problem in which such optical noise deteriorates a S/N ratio in measurement of the signals.

SUMMARY OF THE INVENTION

It is an object of the invention to provide an electro-optic sampling prober that is capable of preventing illumination light causing optical noise from being input to photodiodes so that a S/N ratio is improved.

An electro-optic sampling prober of this invention is basically used to measure a waveform of a measured signal applied to wiring of an IC wafer. Herein, a laser radiates laser beams, which transmit through an optical fiber and are converted to parallel beams by a fiber collimator. The parallel beams are introduced into an optical module containing an optical isolator and photodiodes. Then, the parallel beams pass through an optical wavelength filter to propagate through a prober unit, which is constructed by a reflecting mirror, a dichroic mirror and a half mirror. The parallel beams are incident on an electro-optical element by way of an objective lens.

The electro-optical element is placed on the IC wafer and is changed in polarization state in response to an electric field being caused by the measured signal. The parallel beams are reflected by a surface mirror of the electro-optical element placed opposite to a surface of the IC wafer, so that reflected beams propagate back through the prober unit to input to the optical wavelength filter. Herein, the optical wavelength filter has an optical characteristic such that a center wavelength in transmission of light coincides with a wavelength of the laser beams whose intensities are maximal, so it is possible to prevent components of light, which are not required for measurement, from being unnecessarily returned to the optical module. The reflected beams passing through the optical wavelength filter is introduced into the optical module as returned beams, which are isolated by the optical isolator and are input to the photodiodes to generate electric signals.

During the measurement, a human operator watches an image of a selected portion of the IC wafer presently placed beneath the prober unit to adjust a positional relationship between the prober unit and IC wafer. In order to do so, the electro-optic sampling prober is equipped with a halogen lamp, an infrared camera and a monitor. Herein, the halogen lamp radiates illumination light, which propagate through the prober unit and is incident on the electro-optical element on the IC wafer by way of the objective lens. Then, the illumination light is reflected by the surface mirror of the electro-optical element and is supplied to the infrared camera via the prober unit. Incidentally, the dichroic mirror has a specific optical characteristic such that a transmission factor greatly changes between first and second wavelengths (e.g., 1330 nm and 1500 nm). That is, the dichroic mirror substantially transmits components of light whose wavelengths are smaller than the first wavelength and which are detected by the infrared camera while substantially preventing other components of light whose wavelengths are higher than the second wavelength from being transmitted therethrough.

Due to the aforementioned optical characteristics of the optical wavelength filter and dichroic mirror, it is possible to prevent components of light (i.e., components of the illumination light), which are not required for measurement, from being returned to the optical module. Thus, the photodiodes do not detect such "un-required" components of light, so it is possible to improve a SIN ratio in measurement.

BRIEF DESCRIPTION OF THE DRAWINGS

These and other objects, aspects and embodiment of the present invention will be described in more detail with reference to the following drawing figures, of which.

DESCRIPTION OF THE PREFERRED EMBODIMENT

This invention will be described in detail by way of examples in conjunction with the accompanying drawings.

Figure 1:
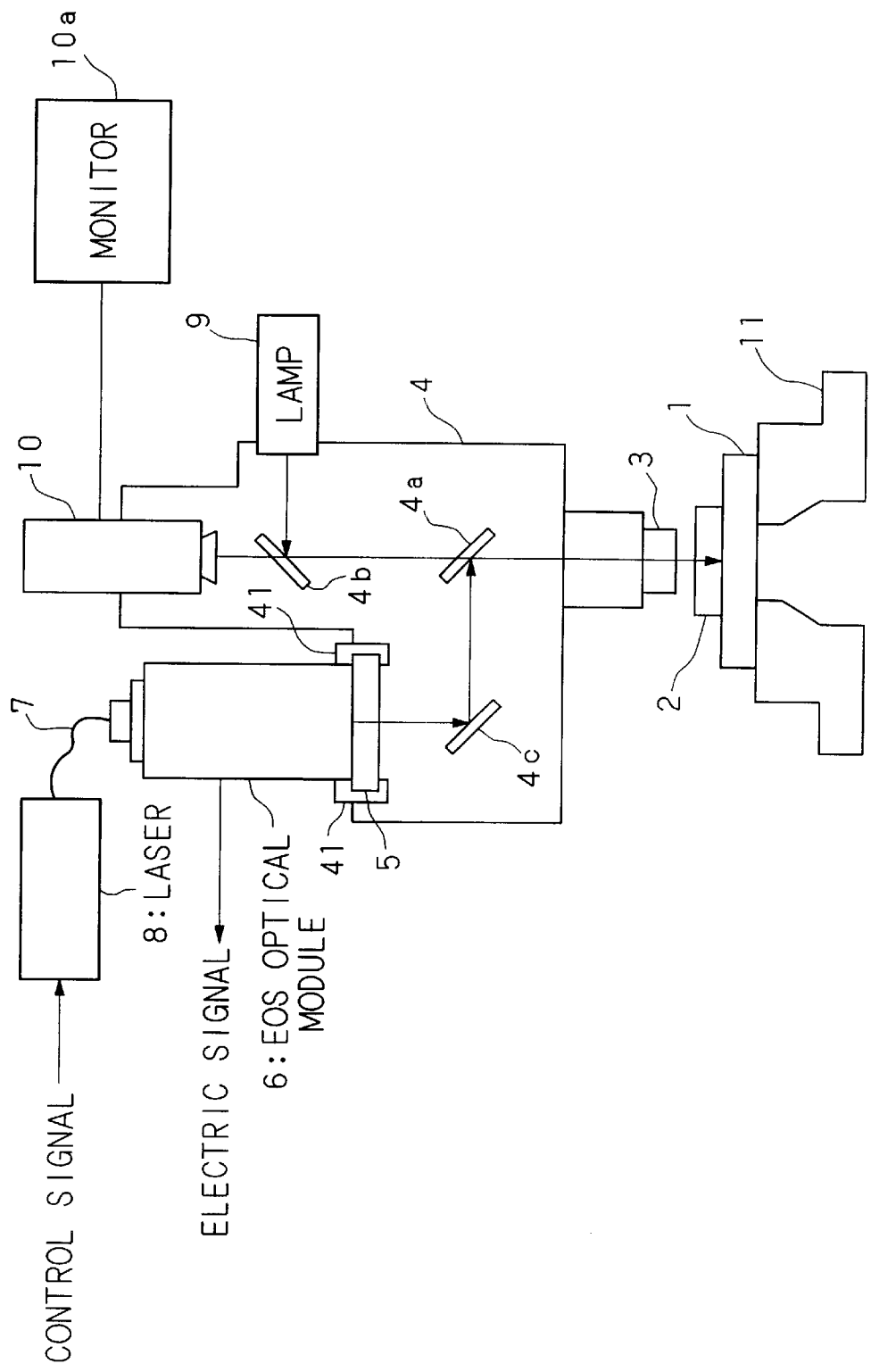
FIG. 1 is a block diagram with a schematic illustration showing a construction of an electro-optic sampling prober in accordance with preferred embodiment of the invention.
Figure 6:
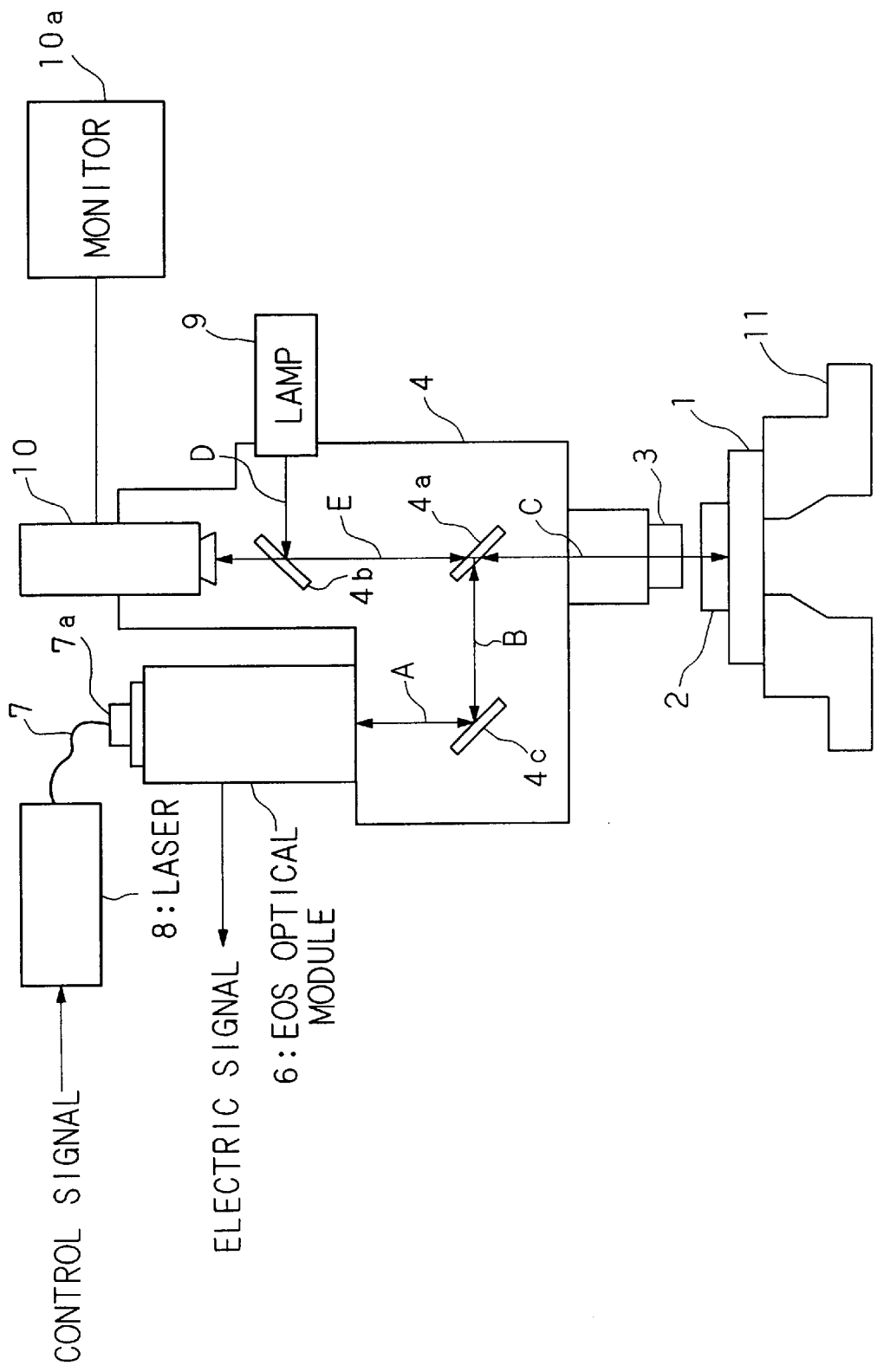
FIG. 6 is a block diagram with a schematic illustration showing an example of a construction of an electro-optic sampling prober.

FIG. 1 shows a construction of an electro-optic sampling prober in accordance with the preferred embodiment of the invention, wherein parts equivalent to those shown in FIG. 6 are designated by the same reference numerals, hence, the description thereof will be omitted according to needs.

As compared with the aforementioned electro-optic sampling prober of FIG. 6, the electro-optic sampling prober of FIG. 1 is characterized by that the EOS optical system 6 has installation/removal members 41, which are equipped with an optical wavelength filter 5.

Figure 2:
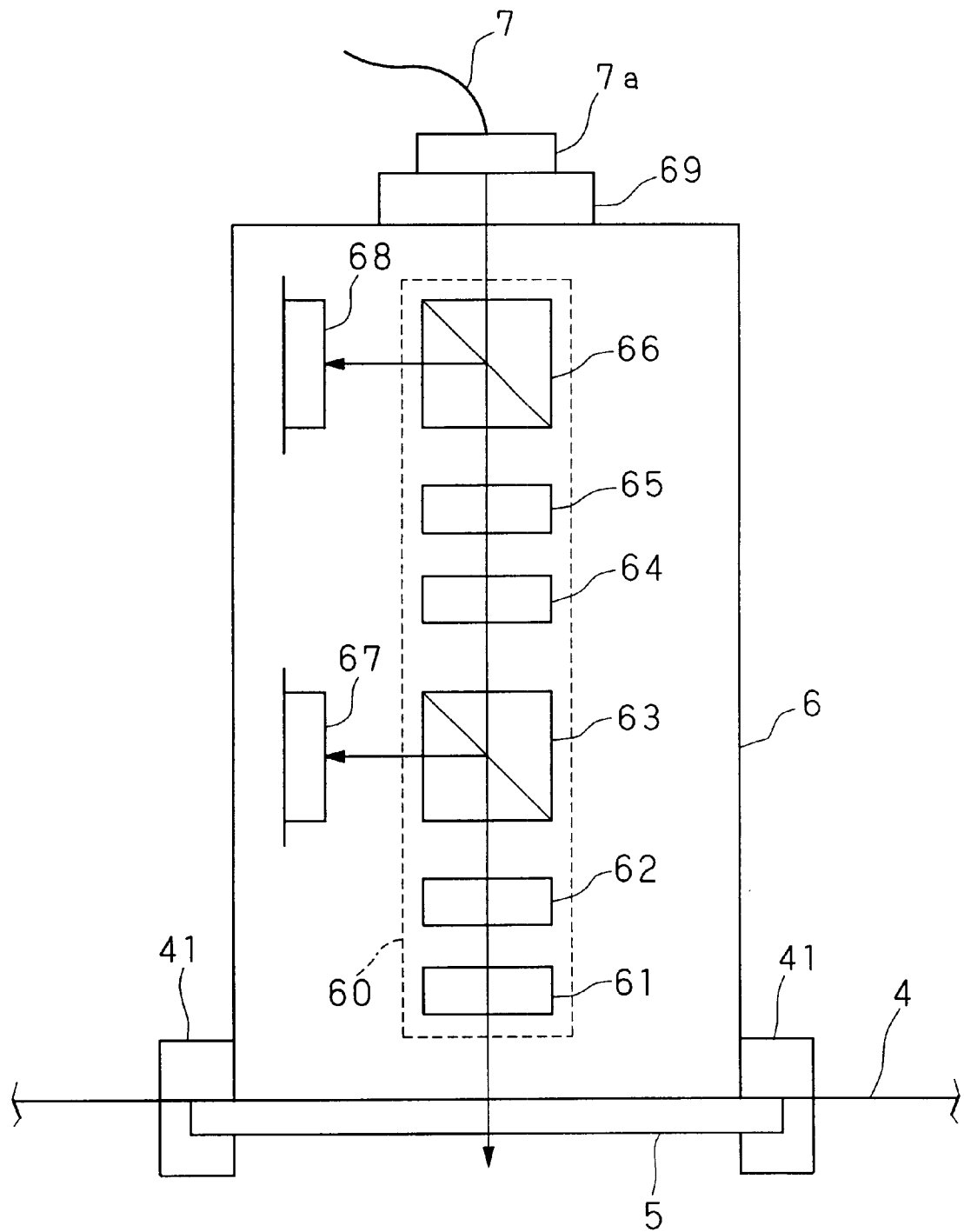
FIG. 2 is an exploded elevational view partly in section showing an internal construction of an EOS optical system shown in FIG. 1.

FIG. 2 shows an internal construction of the EOS optical system 6 in detail. Basic elements of the EOS optical system 6 are polarization beam splitters, wavelength plates and photodiodes. Specifically, FIG. 2 shows an example of practical construction in optics of the EOS optical system 6, which is designed to reduce noise while increasing sensitivity. In FIG. 2, there are provided half-wavelength plates (or ½ wavelength plates) 61, 64 as well as a quarter-wavelength plate (or ¼ wavelength plate) 62. In addition, there are provided polarization beam splitters 63, 66 as well as a Faraday rotator 65. So, an optical system corresponding to an optical isolator 60 is constructed by the half-wavelength plates 61, 64, quarter-wavelength plate 62, polarization beam splitters 63, 66 and Faraday rotator 65. Other than the aforementioned elements 61 to 66 of the optical isolator 60, the EOS optical system 6 is further equipped with photodiodes 67, 68.

The EOS optical system 6 can be installed in and removed from the prober unit 4. So, the EOS optical system 6 is fixed to the prober unit 4 by means of the installation/removal members 41. In addition, the installation/removal members 41 are equipped with the optical wavelength filter 5. Herein, the optical wavelength filter 5 is fixed to the installation/removal members 41 to guarantee a sealed condition of the prober unit 4 when the EOS optical system 6 is removed from the prober unit 4.

Figure 3:
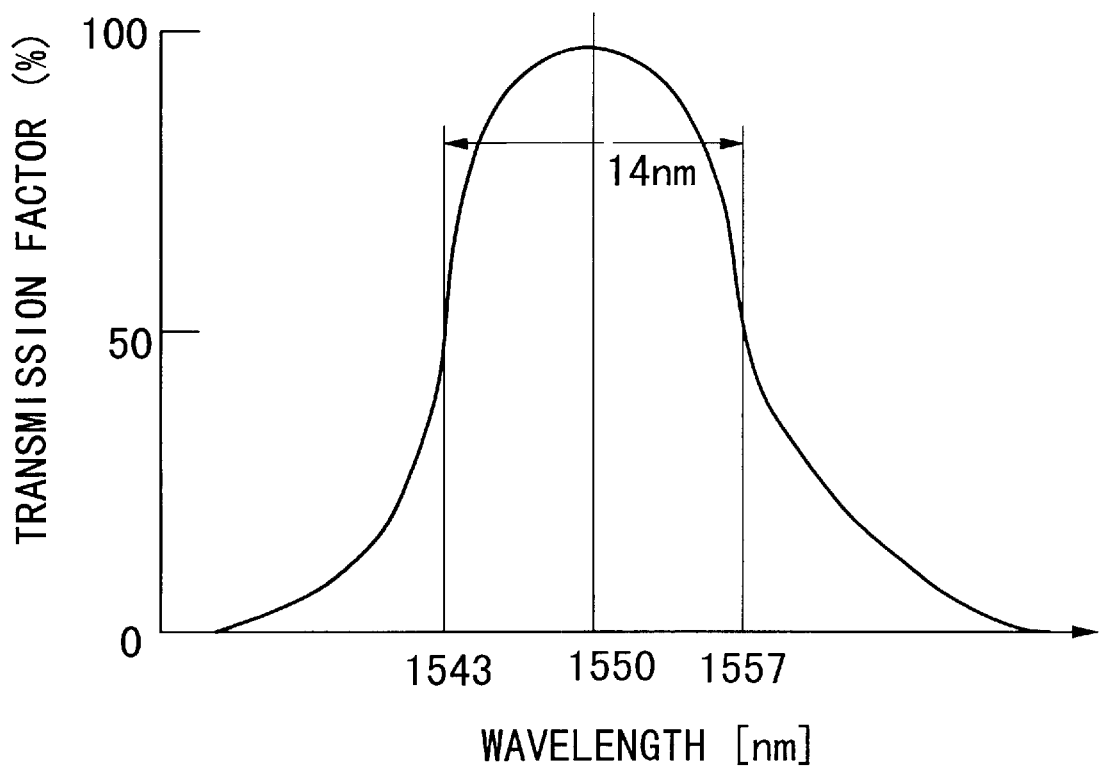
FIG. 3 is a graph showing an optical characteristic in transmission of an optical wavelength filter shown in FIG. 1 with respect to wavelength.

FIG. 3 shows an optical characteristic in transmission of the optical wavelength filter 5 with respect to wavelength, wherein a horizontal axis represents "wavelength" while a vertical axis represents "transmission factor". FIG. 3 shows that a center wavelength of transmitted light, which transmits through the optical wavelength filter 5, is 1550 nm, while a half band width is 14 nm. The aforementioned center wavelength coincides with a wavelength of laser beams, which are radiated from the laser 8 to have a maximum intensity.

The half band width of the optical wavelength filter 5 should be sufficiently broader than a wavelength half-width of the laser beams. Because, narrow wavelength half-width of the laser beams, which is narrower than the half band width, causes problems in which optical pulse widths are broadened or pulse shapes are changed.

Next, measurement operations for measuring signals on the IC wafer 1 will be described with reference to FIGS. 1 and 2.

First, laser beams output from the laser 8 transmits through the optical fiber 7 and are converted to parallel beams by the fiber collimator 7a.

Then, the parallel beams propagate straight through the optical isolator 60, so that the parallel beams transmit through the optical wavelength filter 5. In this case, the optical wavelength filter 5 has the optical characteristic shown in FIG. 3 in which the center wavelength thereof coincides with the wavelength of the laser beams whose intensities are maximal. For this reason, the optical wavelength filter 5 transmits almost all of the beams which propagate straight through the optical isolator 60.

Thereafter, the laser beams are output from the EOS optical system 6 and are introduced into the inside of the prober unit 4. In the prober unit 4, the reflecting mirror 4c reflects the laser beams by an angle of 90 degrees, so that reflected beams propagate toward the dichroic mirror 4a. The dichroic mirror 4a further reflects the beams by an angle of 90 degrees, so that further reflected beams propagate toward the objective lens 3. The objective lens 3 converges the beams on the surface of the wiring (or wires) of the IC wafer 1.

Certain voltage is applied to the wiring of the IC wafer 1 to cause an electric field, which spreads and is applied to the electro-optical element 2. The electric field applied to electro-optical element 2 causes a phenomenon in which a refractive index changes due to Pockel's effect. Due to such a phenomenon, incoming laser beams are changed in polarization states during propagation through the electro-optical element 2. Then, the laser beams whose polarization states are changed are reflected by a mirror corresponding to a surface of the electro-optical element 2 on the wiring of the IC wafer 1. Thus, the reflected laser beams propagate back along the same optical paths, along which the incoming laser beams propagate and are incident on the electro-optical element 2. Thereafter, the reflected laser beams are introduced into the EOS optical system 6 as its returned laser beams. In the EOS optical system 6, the optical isolator 60 isolates the returned laser beams, which are incident on the photodiodes 67, 68 and are converted to electric signals.

Accompanied with changes in voltage of the measuring point (which is on the wiring of the IC wafer 1), the polarization states of the electro-optical element 2 are changed correspondingly. Changes of the polarization states are reflected by differences between outputs of the photodiodes 67, 68. By detecting such output differences, it is possible to measure the signals applied to the wiring of the IC wafer 1.

Figure 7:
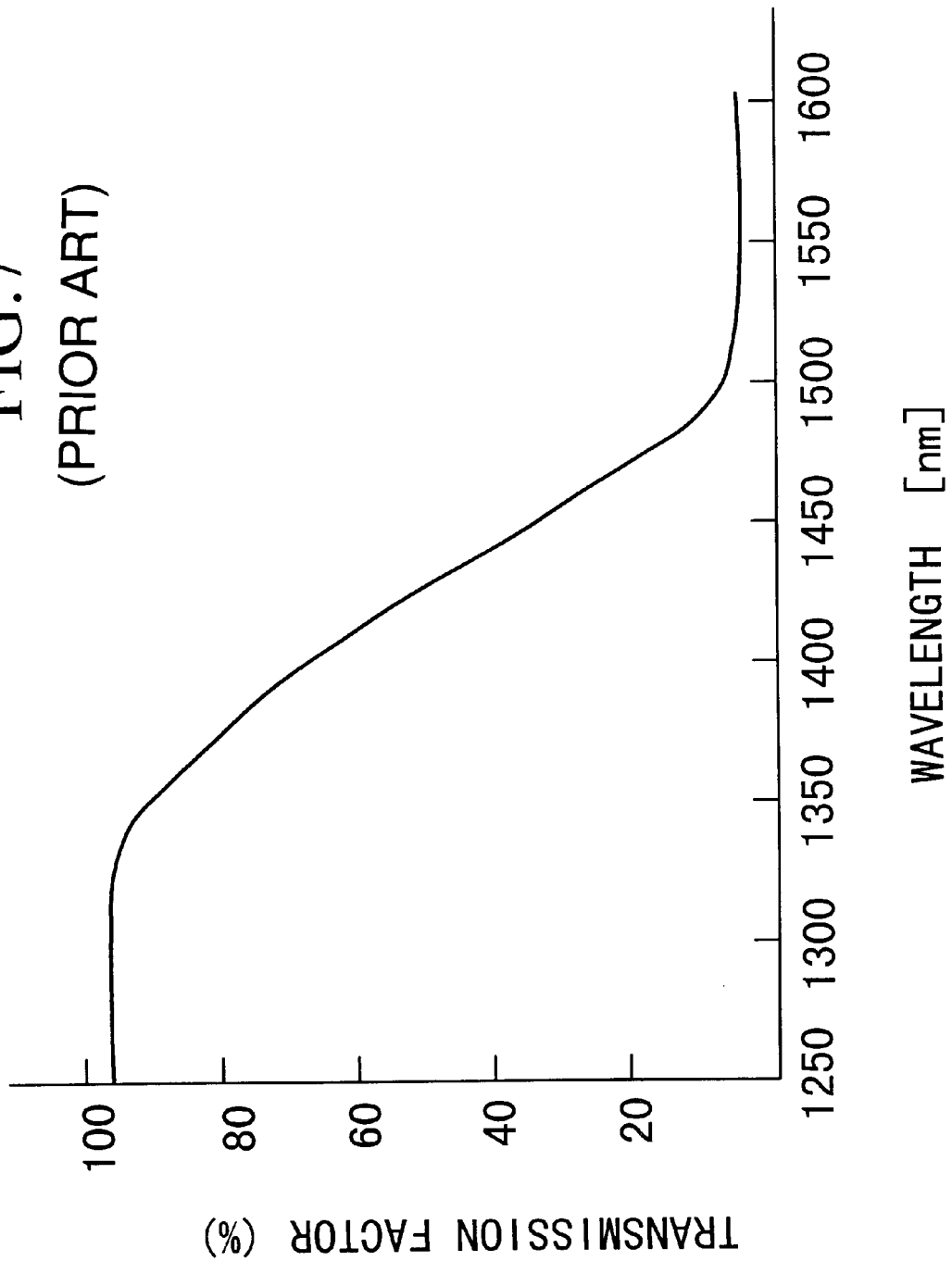
FIG. 7 is a graph showing an optical characteristic in transmission of a dichroic mirror shown in FIG. 6 with respect to wavelength.
Figure 8:
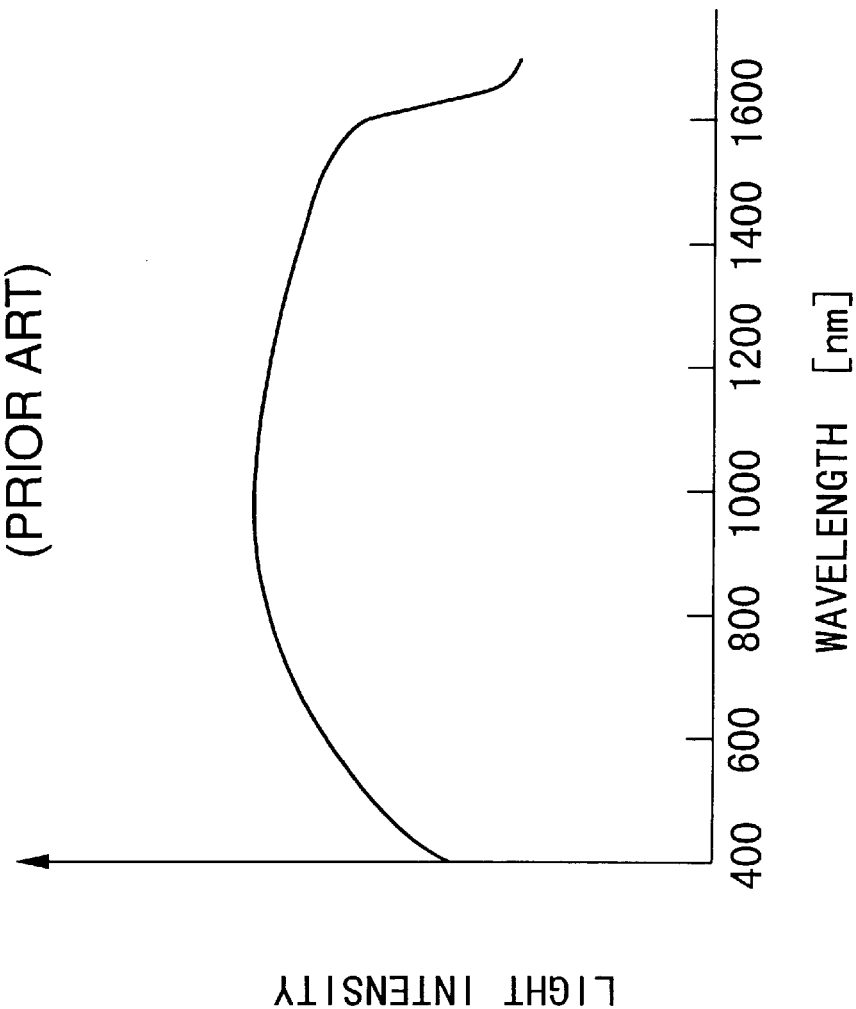
FIG. 8 is a graph showing an optical characteristic in radiation of a halogen lamp shown in FIG. 6 with respect to wavelength.

Next, a description will be given with respect to an optical path of illumination light being radiated from the halogen lamp 9. As described before, the halogen lamp 9 radiates the illumination light, which belongs to a range of wavelengths between 400 nm and 1650 nm. The illumination light having such a wavelength range is irradiated on the half mirror 4b. The half mirror 4b reflects the illumination light by an angle of 90 degrees, so that reflected light propagate toward the dichroic mirror 4a. Herein, the dichroic mirror 4a has the aforementioned optical characteristic shown in FIG. 7. That is, the dichroic mirror 4a has the transmission factor of 5% with respect to light whose wavelength is over 1500 nm. The transmission factor gradually increases as the wavelength of light decreases from 1500 nm. So, the transmission factor is increased to 95% with respect to light whose wavelength is under 1330 nm. Therefore, within reflected light substantially corresponding to the illumination light being reflected by the surface of the electro-optical element 2 on the IC wafer 1, a part of the reflected light whose wavelength is shorter than 1330 nm transmits back through the dichroic mirror 4a as returned light. Then, the returned light that transmits back through the dichroic mirror 4a propagate back toward the half mirror 4. So, the half mirror 4b transmits (a part of) the returned light, which is sensed by the IR camera 10 to produce an image.

As described before, the transmission factor of the dichroic mirror 4a changes from 95% to 5% with respect to the returned light whose wavelength ranges between 1330 nm and 1500 nm within the illumination light being reflected by the surface of the electro-optical element 2 on the IC wafer 1. In other words, the prober unit 4 changes a reflection factor (or reflectance) between 5% and 95% with respect to the illumination light. So, the dichroic mirror 4a reflects a part of the returned light by an angle of 90 degrees, so that reflected light propagate toward the reflecting mirror 4c. Then, the reflecting mirror 4c further reflects the reflected light by an angle of 90 degrees, so that further reflected light is incident on the optical wavelength filter 5.

As shown in FIG. 3, the optical wavelength filter 5 allows transmission of light with respect to a specific range of wavelengths, a center wavelength of which is 1550 nm. So, the optical wavelength filter 5 blocks other components of light, whose wavelengths do not belong to the aforementioned specific range of wavelengths, from being input to the EOS optical system 6.

Within the "original" illumination light radiated from the halogen lamp 9, the EOS optical system 6 inputs a part of the illumination light having a specific wavelength range, which the optical wavelength filter 5 allows transmission therethrough. However, the dichroic mirror 4a has a small transmission factor of 5% with respect to such a specific wavelength range of light. So, the EOS optical system inputs only a small amount of light, whose wavelength range is close to 1550 nm and which may correspond to 5% or less of an original amount of the illumination light being radiated from the halogen lamp 9.

As described above, it is possible to remarkably reduce an amount of the illumination light being input to the EOS optical system 6 by provision of the optical wavelength filter 5.

Figure 4:
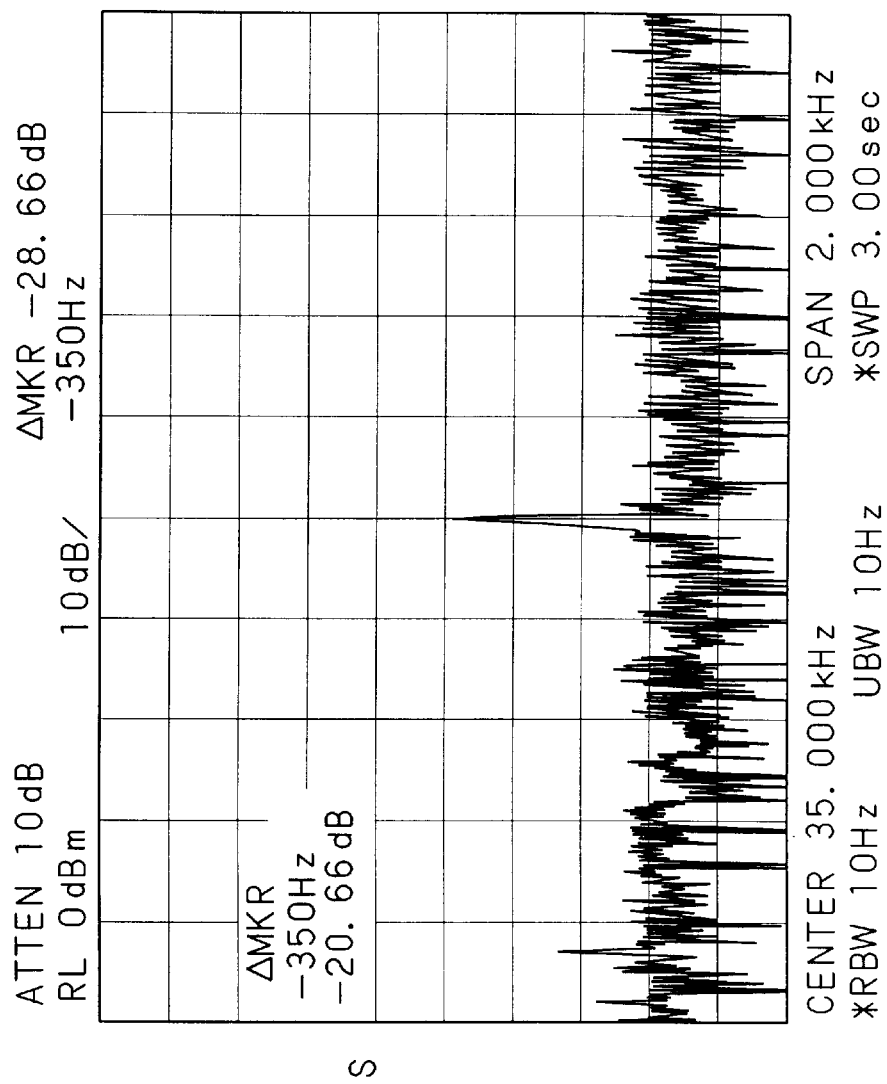
FIG. 4 is a graph showing variations of signal levels with respect to frequencies in connection with the electro-optic sampling prober of FIG. 6.
Figure 5:
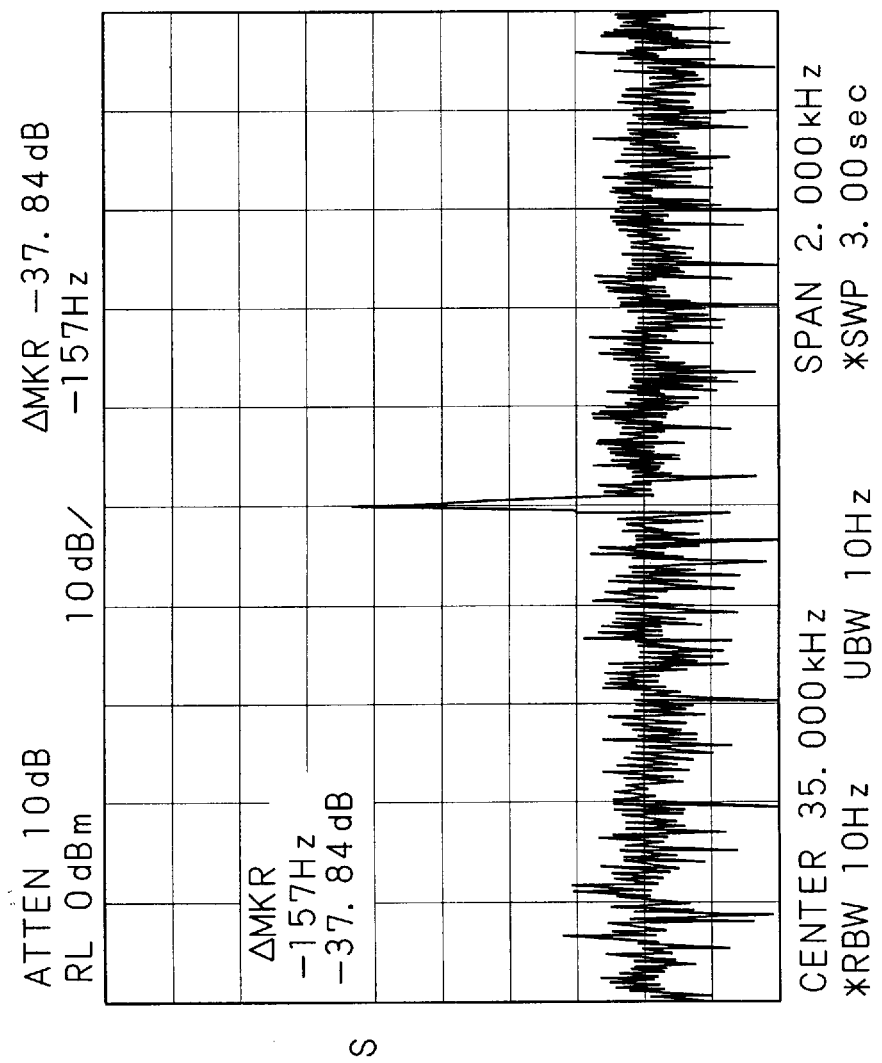
FIG. 5 is a graph showing variations of signal levels with respect to frequencies in connection with the electro-optic sampling prober of FIG. 1.

FIGS. 4 and 5 show graphs regarding S/N ratios being measured with respect to the EOS probers shown in FIGS. 1 and 6, wherein a horizontal axis represents "frequency" while a vertical axis represents "signal level". Specifically, FIG. 4 shows the S/N ratio with regard to the EOS prober of FIG. 6, while FIG. 5 shows the S/N ratio with regard to the EOS prober of FIG. 1. FIGS. 4 and 5 show that as compared with the EOS prober of FIG. 6, the EOS prober of FIG. 1 is capable of improving the S/N ratio by 10 dB or so.

As described above, the EOS prober of the present embodiment is designed such that the optical wavelength filter 5 is arranged by the installation/removal members 41 between the EOS optical system 6 and the prober unit 4, so that the illumination light is prevented from being unnecessarily input to the photodiodes 67, 68. As a result, it is possible to improve the S/N ratio in measurement.

In addition, the optical wavelength filter 5 is attached to the installation/removal members 41 of the prober unit 4. So, it is possible to guarantee the sealed condition of the prober unit 4 even when the EOS optical system 6 is removed from the prober unit 4. Therefore, it is possible to prevent dust and the like from being entered into the prober unit 4. Thus, it is possible to prevent characteristics of optical parts from being deteriorated due to the dust or else being attached to the optical parts inside of the prober unit 4.

In the present embodiment, the optical wavelength filter 5 is arranged to be perpendicular to an optical axis of light transmitting therethrough. However, it is possible to modify the present embodiment such that the optical wavelength filter is arranged to be inclined against the optical axis of the transmitting light. As described before, the optical wavelength filter 5 is designed to allow transmission of selected components of incoming light thereof which propagate thereto along a certain optical axis, so it may partially reflect other components of the incoming light at a surface thereof. However, inclined arrangement of the optical wavelength filter prevents reflected light, corresponding to the other components of the incoming light being reflected by the surface of the optical wavelength filter, from returning back along the same optical axis. In addition, the optical wavelength filter 5 may partially reflect outgoing beams, which are output from the EOS optical system 6 along a certain optical path, at a surface thereof, so that reflected outgoing beams may return back to be input to the photodiodes 67, 68 to cause noise. However, the inclined arrangement of the optical wavelength filter prevents the reflected outgoing beams from returning back along the same optical path to be input to the photodiodes 67, 68.

FIGS. 1 and 2 show that the optical wavelength filter 5 is attached to the installation/removal members 41, by which the EOS optical system 6 is installed in and removed from the prober unit 4. In other words, the present embodiment is designed such that the optical wavelength filter 5 is arranged on an optical axis being connected between the EOS optical system 6 and the reflecting mirror 4c. However, it is possible to modify the present embodiment such that the optical wavelength filter is arranged at any position on the optical axes being connected between the EOS optical system 6 and the dichroic mirror 4a.

As described heretofore, this invention has a variety of technical features and effects, which are summarized as follows:

(1) The electro-optic sampling prober of this invention is characterized by providing an optical wavelength filter, which is arranged on an optical path to allow transmission of only the laser beams having a specific wavelength range while preventing illumination light from being unnecessarily incident on photodiodes. Thus, it is possible to eliminate noise components of light, so it is possible to improve a S/N ratio in measurement.

(2) A center wavelength in transmission of light of the optical wavelength filter coincides with the wavelength of the laser beams whose intensities are maximal. Thus, the optical wavelength filter is capable of efficiently transmitting the laser beams. In addition, it is possible to avoid attenuation of light of signal components, regardless of provision of the optical wavelength filter.

(3) The optical wavelength filter is arranged in connection with the installation/removal members, by which the EOS optical system is fixed to the prober unit. So, it is possible to maintain the sealed condition of the prober unit even when the EOS optical system is removed from the prober unit.

(4) The aforementioned embodiment can be modified such that the optical wavelength filter is arranged with being inclined against the optical axis. Thus, it is possible to avoid occurrence of reflected light, which is unnecessarily reflected by the surface of the optical wavelength filter.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. An electro-optic sampling prober comprising:

a laser for radiating laser beams based on a control signal;

an electro-optical element which is placed in contact with wiring of an IC wafer which is a measured subject, wherein an electric field caused by a measured signal applied to the wiring of the IC wafer is applied to the electro-optical element to be changed in optical characteristic;

an optical module which is configured using polarization beam splitters, wavelength plates and photodiodes, wherein the optical module isolates reflected beams, which are produced by reflection of the laser beams transmitting through the electro-optical element by a surface of the electro-optical element placed opposite to the wiring of the IC wafer, so that the optical module converts the reflected beams to electric signals;

a lamp for illuminating the IC wafer with illumination light;

a prober unit for enclosing an optical path along which the laser beams propagate and an optical path along which the illumination light propagate;

an infrared camera for producing an image of the IC wafer which is illuminated by the lamp;

a dichroic mirror for separating the laser beams from the illumination light;

an optical wavelength filter which is arranged on an optical path connected between the dichroic mirror and the photodiode; and wherein the optical wavelength filter is attached to installation/removal members, by which the optical module is fixed to the prober unit.

* * * * *